United States Patent [19]
Briggs

[11] 3,947,759
[45] Mar. 30, 1976

[54] LEAKAGE CURRENT MONITORING SYSTEM AND METHOD
[75] Inventor: James B. Briggs, La Canada, Calif.
[73] Assignee: Continental Engineering, Inc., Arcadia, Calif.
[22] Filed: Sept. 16, 1974
[21] Appl. No.: 506,434

[52] U.S. Cl. .................................. 324/51; 340/255
[51] Int. Cl.² .......................................... G01R 31/02
[58] Field of Search ............ 324/51; 317/18 D, 18 R, 317/27 R; 340/255

[56] References Cited
UNITED STATES PATENTS

| | | | |
|---|---|---|---|
| 2,623,107 | 12/1952 | Baughman | 340/255 |
| 2,991,397 | 7/1961 | Place | 340/255 X |
| 2,999,231 | 9/1961 | Kusters et al. | 324/51 X |
| 3,066,284 | 11/1962 | McKinley et al. | 324/51 X |
| 3,666,993 | 5/1972 | Legatti | 340/255 X |
| 3,699,392 | 10/1972 | Lee et al. | 324/51 X |
| 3,737,765 | 6/1973 | Lee et al. | 324/51 |
| 3,754,221 | 8/1973 | Stelter | 340/255 |
| 3,757,169 | 9/1973 | Beresnikow | 324/51 X |
| 3,868,665 | 2/1975 | Treglown | 340/255 |

Primary Examiner—Gerard R. Strecker
Attorney, Agent, or Firm—Lyon & Lyon

[57] ABSTRACT

A device is disclosed herein for monitoring a power system for the presence of faults thereon which cause leakage currents to ground. The device includes a test impedance and bridge switching means for connecting the test impedance in different combinations to a pair of power lines. A singe test impedance is connected in four different configurations to the power lines in sequence, and this cycle is continuously repeated. Currents are measured for each connection to determine whether or not a leakage or hazard current exists which results from a fault load on one or both power lines. The device includes control means for operating the test impedance switching means, and includes current level detecting means for providing an alarm indication in the event a predetermined hazard current exists.

18 Claims, 20 Drawing Figures

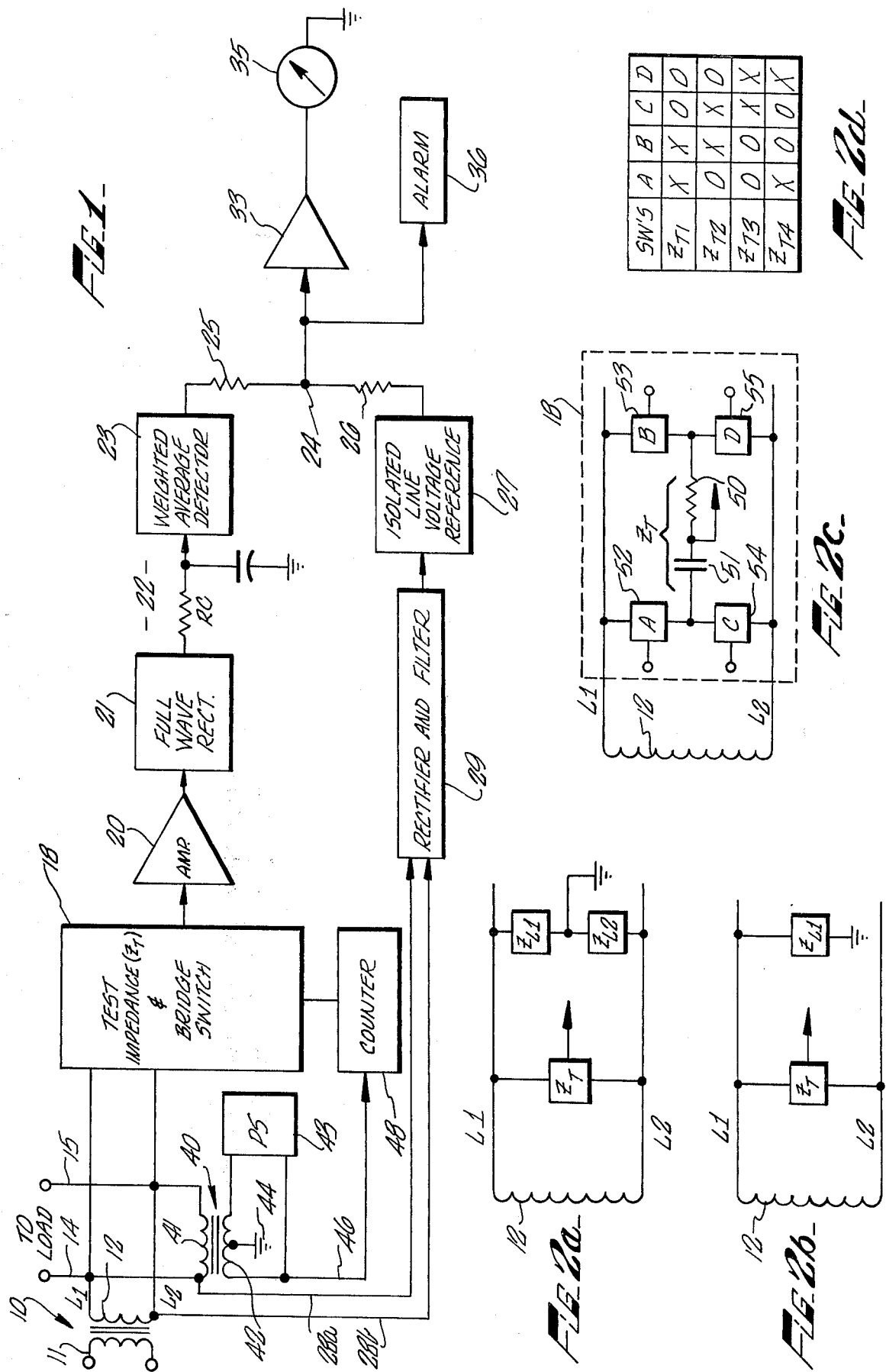

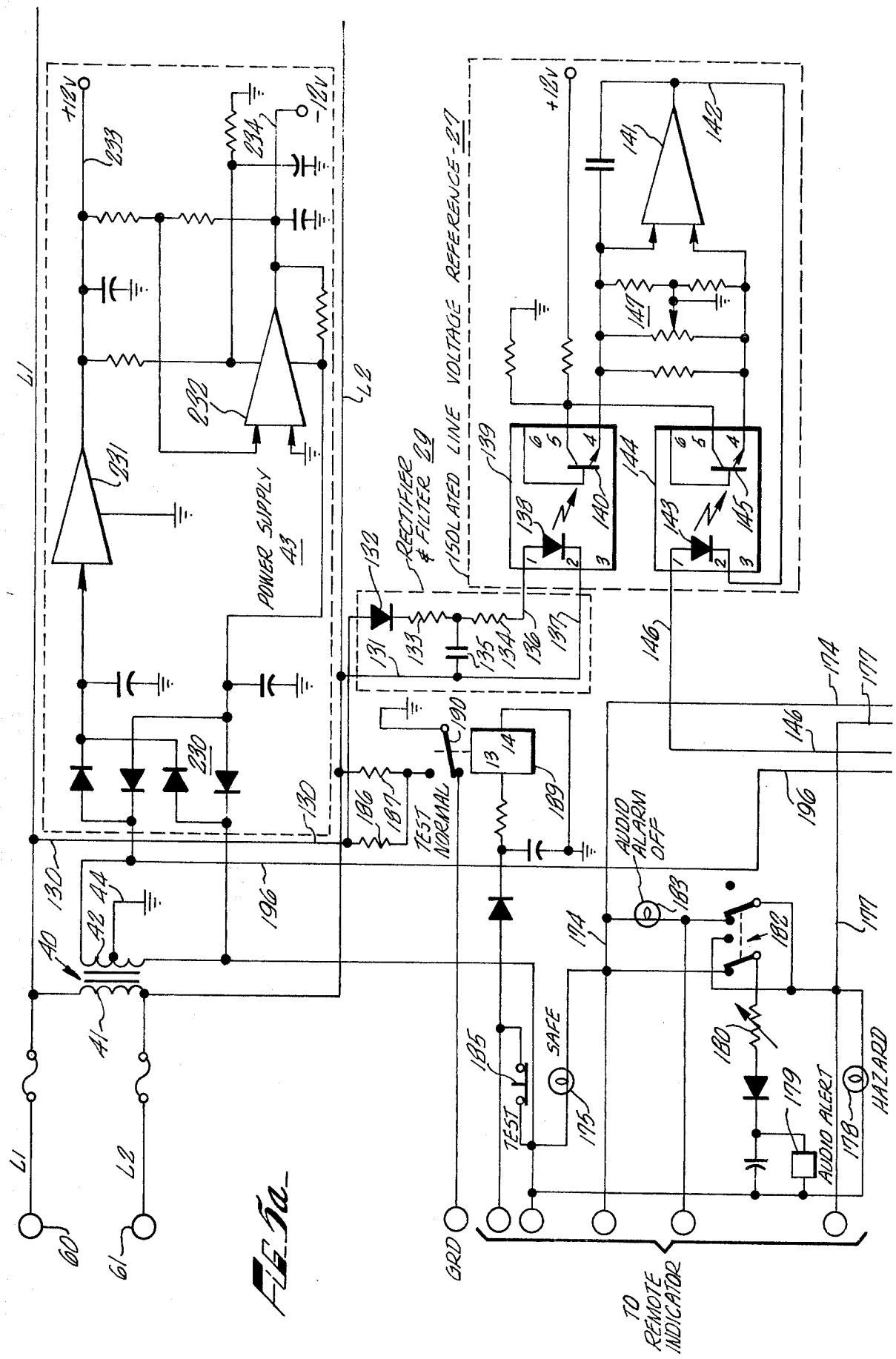

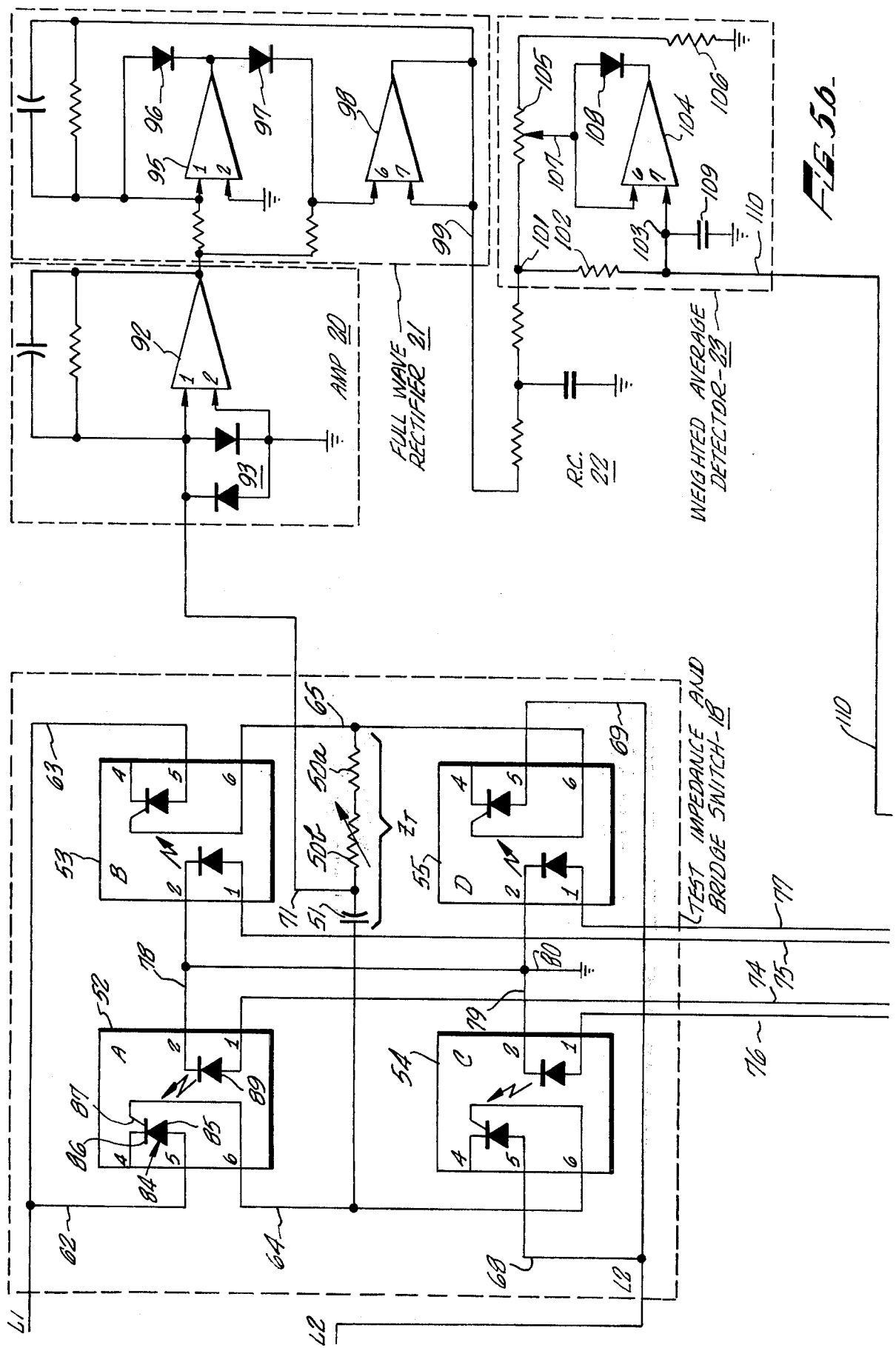

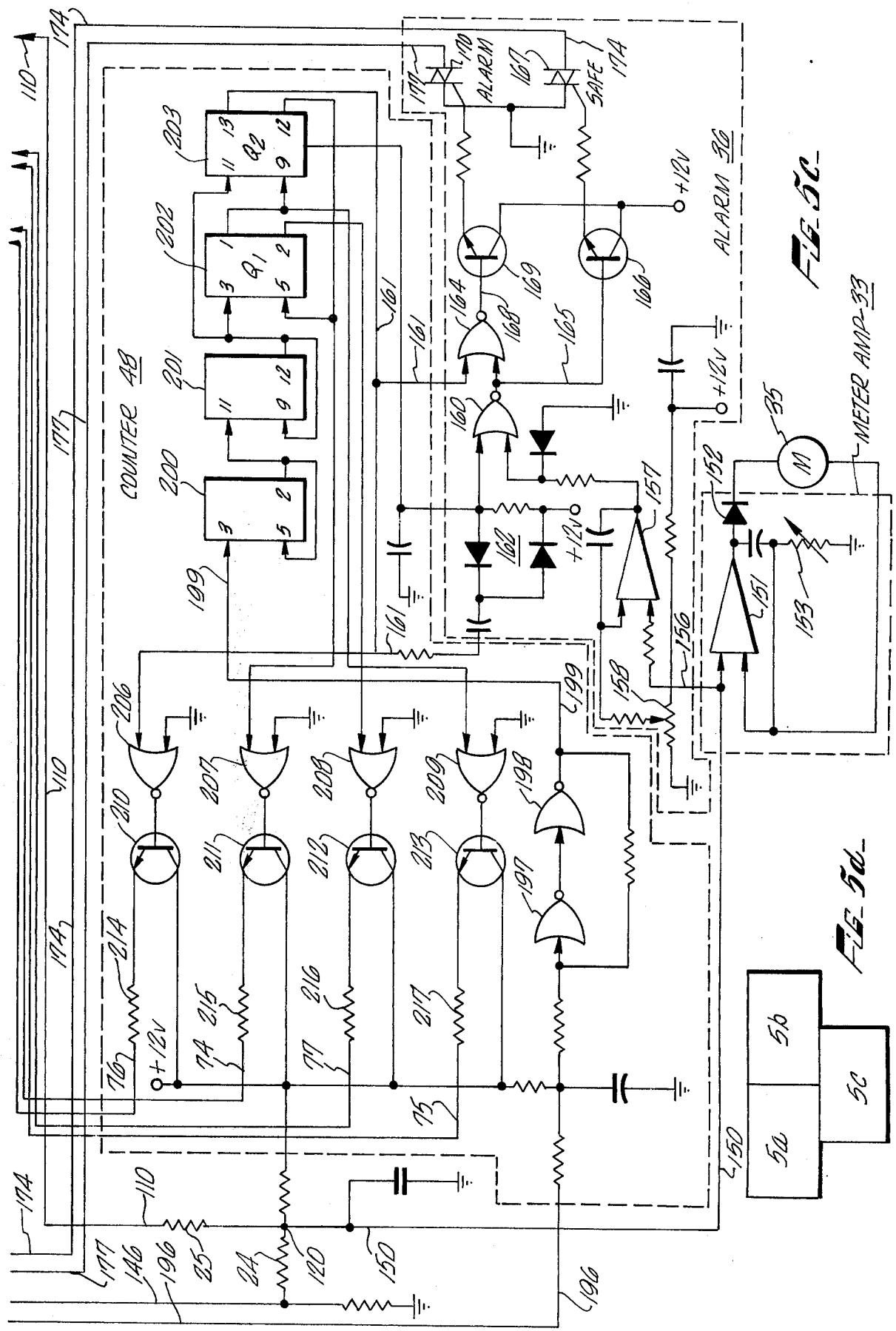

LEAKAGE CURRENT MONITORING SYSTEM AND METHOD

BACKGROUND OF THE INVENTION

The present invention relates to a power line monitoring device or system, and more particularly to an improved system of this nature for monitoring line isolation and the existence of fault currents resulting from fault loads on the power line or lines.

In various installations wherein a load or loads are connected to a power supply, there is the possibility of a fault condition occurring wherein there is a current flow to ground, as in the case where a low leakage impedance occurs between one or both power lines to ground because of faulty insulation or other causes. In many instances a hazardous leakage current condition results. It thus is desirable to sense or monitor the existence of faults to ground, particularly those occurring on an isolated ac power distribution network. A major application for monitoring devices of this nature is for hospital use because of the rapidly increasing use of electro-medical apparatus in the care of patients. Such apparatus are used in hospital intensive care wards, surgeries, and other hospital locations, and the monitoring of current leakage to ground is paramount for the safety of patients.

Various types of monitoring devices for monitoring such leakage current to ground have been devised. Exemplary systems are described in U.S. Pat. No. 2,999,231, No. 3,066,284 and No. 3,666,993. The typical system generally involves the use of several test impedances connected to the power lines for determining the existence of predetermined fault currents.

The present invention contemplates, in a preferred embodiment thereof, a line isolation monitor system which is relatively simple, sensitive and efficient, and is particularly adaptable to hospital and other uses. In a hospital application, for example, the conventional power supply includes a balanced isolated transformer with a floating secondary. When no fault condition exists, the patient can be connected to either side of the secondary without danger. A high quality ground usually is used throughout the system wherein beds, window frames, electrical instruments, and the like are all connected to a common ground point, and with the floating power system, even if the patient touches one side of the secondary there is no problem. However, in the event of the occurrence of a leakage path involving current of sufficient magnitude, a hazardous condition exists.

In a preferred embodiment according to the present invention, a relatively simple balanced test impedance is employed, and is sequentially connected to one or both of the power lines in four predetermined test impedance configurations, and this four position sampling is repeated. The current which flows as a result of the connection of the test impedance in each of the configurations is measured to ascertain whether or not a hazardous current level exists. When the current level exceeds a safe level an alarm indication is provided. The construction and operation of the invention will become more apparent through a consideration of the following description, taken in conjunction with the drawings in which:

FIG. 1 is a block diagram of a preferred embodiment of a line monitoring system according to the present invention;

FIGS. 2a and 2b are simplified circuit diagrams indicating fault load conditions on power lines;

FIG. 2c is a simplified diagram of a test impedance and bridge switching circuit therefor, and FIG. 2d is a switching table for the switching circuit.

FIGS. 5a through 5c, when arranged as shown in FIG. 5d, illustrate the circuit and logic diagram of the present system.

DETAILED DESCRIPTION OF PREFERRED EMBODIMENT

Figure 3A:
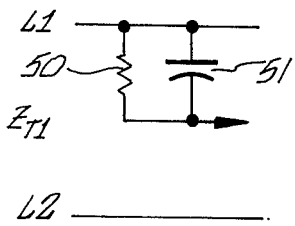
FIGS. 3a through 3d are simplified circuit diagrams indicating four test impedance configurations connected to the power lines in conducting the line monitoring operation.

Turning first to FIG. 1, a block diagram of the present system is shown wherein a transformer 10 with a primary winding 11 and a secondary winding 12 represents a typical balanced and isolated transformer power supply, such as that used in hospitals. Power lines $L_1$ and $L_2$ are connected to the secondary 12, and these lines are connected to respective lines 14 and 15 of the power distribution system and with which one or more loads are connected. The remainder of the system illustrated in FIG. 1 shows the components of a preferred embodiment of a line monitoring system according to the present invention.

The present system includes a test impedance and switching circuit 18 therefor which is connected to the power lines $L_1$ and $L_2$. As will be explained in greater detail subsequently, the circuit 18 includes a test impedance and a bridge-type switching circuit for connecting the test impedance to the two lines $L_1$ and $L_2$ in four different impedance configurations. The test impedance includes a center tap at which the current to ground is measured by the circuit to the right of 18 as seen in FIG. 1.

The test current output from the bridge circuit 18 is applied to an amplifier 20, the output of which is applied to a full wave rectifier 21. The output of the rectifier 21 is connected to an RC circuit 22. As will be apparent, the amplifier 20 amplifies the test current, and the output of the amplifier is rectified by the rectifier 21 to provide pulsed half sine waves. The RC circuit 22 forms a low pass filter and changes the pulsed half sine waves to a stepped waveform. The RC circuit 22 is connected to a weighted average detector 23 which functions to provide a weighted average output of the input signals thereto as will become more apparent when considering the current waveforms of FIGS. 4a–4c. The output of the weighted average detector 23 is connected to a summing junction 24 through a resistor 25. A signal proportional to line voltage is applied to the summing junction 24 through a resistor 26 from an isolated line voltage reference circuit 27. This line voltage reference is obtained from lines 28a and 28b connected to lines $L_1$ and $L_2$ through a rectifier and filter 29 connected to the reference circuit 27. This circuit enables line voltage fluctuations to be subtracted and ignored.

The summing junction 24 is connected to an amplifier 33, the output of which is connected to a meter 35 which indicates the magnitude of the leakage or fault current. The summing junction 24 also is connected to an alarm circuit 36. This alarm circuit may include several visual indicators, as well as an audio alert device. For example, the alarm circuit 36 preferably includes an indicator light for indicating a normal safe condition, and an indicator light and audible alert for indicating a hazardous current condition.

The system of FIG. 1 also includes a transformer 40 having a primary 41 connected across the power lines $L_1$ and $L_2$, and a secondary 42 connected to a power supply 43. The center tap of the secondary 42 is grounded at 44 as seen in FIG. 1. The power supply 43 serves as the power supply for the remaining components of the system of FIG. 1. The secondary winding 42 also is connected through a line 46 to a counter circuit 48 which provides drive signals for the switches of the test impedance and switch circuit 18. The line 46 supplies 60 hertz signals as the clock for the counter 48. These 60 hertz signals are divided down by the counter to 8 hertz signals which, in turn, are applied through driver circuits to four switches arranged in a bridge-type configuration in the circuit 18.

Turning now to FIGS. 2a and 2b, these Figures diagramatically illustrate fault load conditions. As is seen in each, the secondary 12 of the transformer 10 (FIG. 1) is connected to upper and lower lines $L_1$ and $L_2$. Fault loads are designated $Z_{L1}$ and $Z_{L2}$. In FIG. 2a, both lines are loaded with $Z_{L1}$ and $Z_{L2}$, the junction between the two loads being grounded. This fault loading may be either balanced wherein $Z_{L1}$ is equal to $Z_{L2}$, or may be hybrid wherein $Z_{L1}$ is different from $Z_{L2}$ (such as, one may be resistive and the other may be reactive). The block labeled $Z_T$ diagramatically designates the test impedance which is connected across lines $L_1$ and $L_2$ or to one line or the other as will be explained later. The diagramatic circuit shown in FIG. 2b is similar to that shown in FIG. 2a, but only one line is loaded. As shown in FIG. 2b, a load $Z_{L1}$ is connected to the upper line $L_1$. Another possible loading is with $Z_{L2}$ connected (not shown) to lower line $L_2$. With any of the fault conditions, the present monitor system measures the ground current between the test and load impedances.

FIG. 2c illustrates diagramatically the bridge switching circuit by which the test impedance $Z_T$, comprising a resistor 50 and a capacitor 51, is connected to the lines $L_1$ and $L_2$ in various possible combinations. Bidirectional electronic switches 52 through 55 are connected with lines $L_1$ and $L_2$ and the test impedance $Z_T$ As shown. The switches 52 through 55 are selectively turned on and off in various combinations so as to cause the impedance $Z_T$ to be connected with one or both of lines $L_1$ and $L_2$ in the manner shown in FIGS. 3a through 3d.

Figure 3B:
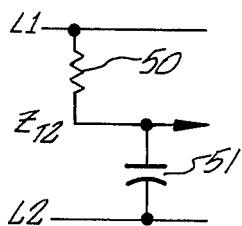
Figure 3C:
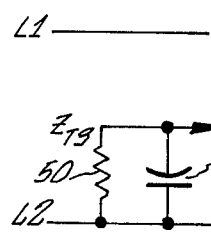
Figure 3D:
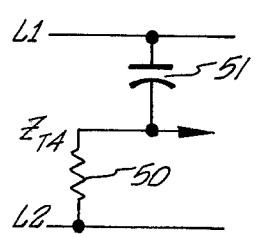

Considering FIGS. 3a through 3d in more detail, the same illustrate the four different impedance/power line combinations which are used in the present line monitor system. FIG. 3a illustrates the test impedance $Z_T$ connected only to line 1, and FIG. 3c illustrates the test impedance connected only to line 2. FIGS. 3b and 3d illustrate two combinations of connecting the test impedance across the lines $L_1$ and $L_2$. In the operation of the monitor system. sampling of the lines $L_1$ and $L_2$ occurs in four-time periods, and FIGS. 3a–3d respectively show the four connections for the test impedance $Z_T$ which are made in response to output control signals from the counter 48 (FIG. 1). An exemplary output frequency of the counter is 8 hertz and thus the four samples occur at the rate of 7.5 per second (in 133 milliseconds). This sequence of connecting the test impedance four ways is repeated cyclically. Each bridge switch is closed for approximately 66.6 milliseconds, and the state of one switch changes every 33.3 milliseconds to cause a different impedance/line connection to ba made. Thus each test impedance configuration (e.g., as shown in FIG. 3a) is connected for 33.3 milliseconds. FIG. 2d is a table illustrating the conditions of the switches 52 through 55 for connecting the impedances as respectively shown in FIGS. 3a through 3d. In FIG. 2d, a "0" indicates that the respective switch is off and an "X" indicates that the switch is on.

Figure 4A:
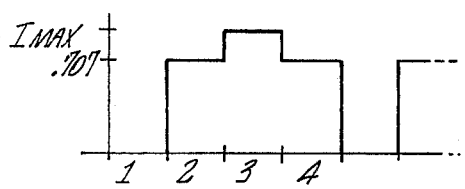
FIGS. 4a through 4c are three waveforms indicating different combinations of fault currents which may exist with respective fault loads shown in FIGS. 4d through 4f.
Figure 4D:
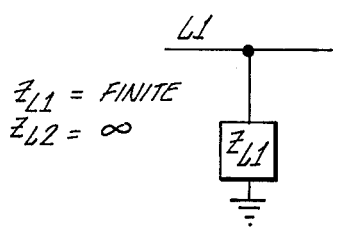
FIG. 4g is a waveform of switching control signals which are used to operate the bridge switches associated with the test impedances and power lines.
Figure 4B:
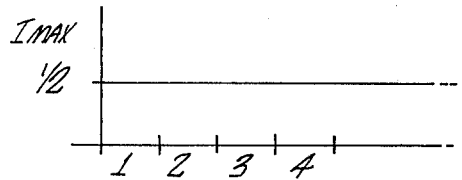
Figure 4E:
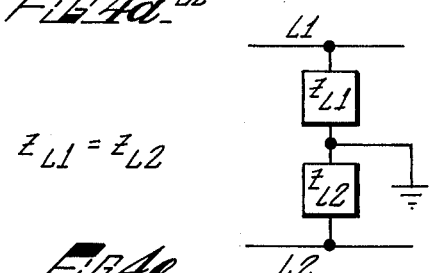
Figure 4C:
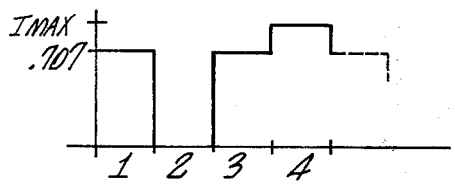
Figure 4F:
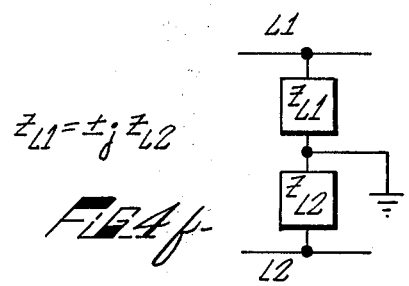
Figure 4G:
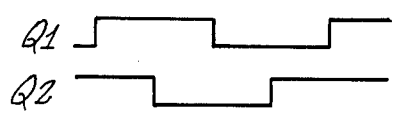

Before discussing the complete circuit and logic diagram of the system shown in FIGS. 5a–5c, the test current waveforms for different types of fault loads as illustrated in FIGS. 4a through 4c will be discussed. FIG. 4a illustrates the test current waveform for four-time periods corresponding to the connection of test impedances $Z_{T1}$ through $Z_{T4}$ as shown in respective FIGS. 3a through 3d for a given fault load condition. As shown to the right in FIG. 4d, the fault load condition involves a fault load $Z_{L1}$ of some finite value and an infinite load $Z_{L2}$. The same type of waveform exists for the opposite situation (not shown), that is a finite load $Z_{L2}$ connected to $L_2$ and an infinite load $Z_{L1}$. In a first time period wherein test impedance $Z_{T1}$ as shown in FIG. 3a is connected to upper line $L_1$, there is no current since the load is balanced; that is there is no return current path between the junction of the resistor 50 and the capacitor 51 of the test impedance to ground. In the second time period wherein the test impedance $Z_{T2}$ as shown in FIG. 3b is connected across lines $L_1$ and $L_2$, as well as in the fourth time period wherein the test impedance $Z_{T4}$ as shown in FIG. 3d is connected across the lines, the current is 0.707 of the maximum value. With a 120 volt ac power system, the voltage under this test condition is 60 volts at a 90° phase angle and, therefore, less than the maximum current exists. The current is equal to = $1/\sqrt{2} \times I_{max}$. Finally, in the third time period wherein the test impedance $Z_{T3}$ as shown in FIG. 3c is connected to the lower line $L_2$, the current is at a maximum, and is equal to $$\frac{120V}{Z_{T3} + Z_{L1}}.$$

FIG. 4b illustrates the current waveform wherein the load impedances $Z_{L1}$ and $Z_{L2}$ as seen in FIG. 4e are equal, and this condition represents a balanced fault loading of lines $L_1$ and $L_2$. In this case, the waveform for all four-time periods 1 through 4 of FIG. 4b is one half the maximum current.

FIG. 4c illustrates a hybrid loading on both of the lines $L_1$ and $L_2$ wherein one of the $Z_L$ loads in FIG. 4b is resistive and the other is reactive, i.e., $Z_{L1} = \pm Z_{L2}$. As can be seen from FIG. 4c, the current is 0.707 of maximum in the first time period, zero in the second time period, 0.707 of maximum in the third time period, and maximum in the fourth time period. From an examination of the waveforms in FIGS. 4a and 4c, it will be seen that the waveform in FIG. 4c is the same as that in FIG. 4a, but shifted 90°. The waveforms in FIGS. 4a–4c illustrate the currents that flow under the four test conditions out of the junction of resistor 50 and capacitor 51, and into the input of amplifier 20.

As will be apparent from an examination of the current waveforms in FIGS. 4a through 4c, it is necessary to detect a predetermined current having either of two characteristics. That is, (1) where there is a load on one line and a hybrid load on two lines wherein the waveforms of FIG. 4a and 4c exist, and (2) where there is a balanced load on both lines resulting in the level current waveform shown in FIG. 4b. The current waveforms in FIGS. 4a and 4c may be considered to be dc waveforms with an ac component, and the current waveform in FIG. 4b is a dc level. The monitor circuit receives these two types of current waveforms and provides the same control output for both as will be explained in detail subsequently. Basically, a weighted average of both types of waveforms is taken such that an output signal is derived that is the same for the level waveform in FIG. 4b as it is for the varying waveforms of FIGS. 4a and 4c. This results in a dc error signal derived from these two types of waveforms, which error signal is equal for the four test impedance conditions. When the error signal reaches a predetermined level or threshold, this corresponds with a hazard current condition and an alarm is provided.

Turning now to FIGS. 5a–5c, the same illustrate when arranged as indicated in FIG. 5d the complete circuit and logic system for a preferred embodiment of the present line isolation monitor. Input terminals 60 and 61, shown in the upper left-hand corner of FIG. 5a, represent terminals which are connected to the secondary 12 of the power supply transformer 10 (FIG. 1), and from which lines L1 and L2 extend to the monitor system. Both of these lines are fused as shown, and are connected to the primary winding 41 of the local power supply transformer 40. This power supply merely supplies power to the various circuits and logic boxes, and this portion of the circuit will be discussed later.

The supply lines L1 and L2 extend past the power supply 43 in FIG. 5a and are connected to the test impedance and bridge switch 18 at the left side of FIG. 5b. The circuit 18 includes a bridge switch comprising four optically coupled switches 52 through 55 as seen in FIG. 5b. Each of these switches 52 through 55 corresponds to a single-pole, single-throw switch, and they are turned on and off under control of the counter 48 (FIG. 5c) to be discussed later. These four switches correspond to the four similar switches shown in FIG. 2c and operate in the same manner to provide four-position sampling of the two lines $L_1$ and $L_2$ with the test impedance $Z_T$ as described earlier in connection with a discussion of FIGS. 2 and 3.

The upper two switches 52 and 53 are connected to the upper line L1 by respective wires 62 and 63, and are connected by respective wires 64 and 65 to the test impedance $Z_T$ comprising the capacitor 51, a resistor 50a and a variable resistor 50b. The lower line L2 is connected to the switches 54 and 55 by respective lines 68 and 69, and these two switches are connected by the respective lines 64 and 65 to the test impedance $Z_T$. The junction 70 between the capacitive reactance 51 and the resistance 50a–50b is connected by a line 71, which forms the output of the test impedance and bridge circuit 18, as an input to amplifier 20 as will be discussed later. Control lines 74 through 77 from the counter 48 of FIG. 5c are connected to the respective switches 52 through 55 to control turn-on and turn-off of these switches. A return ground connection for the control signals for these four switches is provided by lines 78 and 79 connected to a ground line 80. Two of the switches 52 through 55 together perform the function of a double throw switch.

Turning more particularly to the switches 52 through 55, all four are identical and may each comprise an H11-C2 optically coupled switch sold by General Electric. Inasmuch as they all are alike, only the switch 52 will be described in detail. The switch 52 includes, as the switch component, a light activated silicon controlled rectifier 84 having an anode 85, a cathode 86 and a gate 87. As can be seen from FIG. 5b, the power supply line L1 is connected to the anode 85 of the switch 84, and the line 64 from the test impedance $Z_T$ is connected to the gate of the switch 84. The cathode is not used, although if desired a resistor can be connected from the cathode to the anode to adjust the trigger sensitivity of the switch. The switch 52 further comprises a light emitting diode (LED) 89 connected from the control line 74 to ground through the lines 78 and 80. As will be apparent, a signal on the control line 74 causes current to flow through the LED 89 to ground, thereby causing the LED to emit light. When this occurs, the switch 84 is turned on, thereby connecting the line L1 through wires 62 and 64 to the left-hand terminal of the capacitor 51 of the test impedance $Z_T$. In a similar manner, a control signal applied on line 76 to the switch 54 will cause this switch to turn on and thereby connect the lower line L2 through wires 68 and 64 to the left-hand terminal of the capacitor 51. Likewise, a control signal on line 75 turns on the switch 53 which, in turn, connects upper line L1 to the right-hand side of the resistor 50 of the test impedance $Z_T$. Similarly, a control signal on line 77 turns on the switch 55 which connects the lower line L2 to the right-hand side of the resistor of the test impedance.

Through the use of the gate and anode of the semiconductor switch in each of the switches 52 through 55, each of these semiconductor switches has the characteristics of a transistor but is bipolar (acts the same for either polarity applied to the anode-gate thereof). The bridge arrangement as shown in FIG. 5b therefore is important in allowing the use of a single test impedance $Z_T$ to be used (as distinguished from four or more individual test impedances) for connection to the lines in the four combinations. Only one adjustment is necessary in set-up of the test impedance; that is, resistor 50b is adjusted so that the resistance and the capacitive reactive components of the test impedance are equal and the test impedance has a 45° phase angle. With this arrangement, the response of the test impedance is the same for a resistive or a capacitive fault load. Through the use of a single test impedance $Z_T$, no component matching is necessary (as with four separate test impedances), and ensures that the test impedance will be identical for each of the four samples and enables good accuracy in line monitoring to be achieved.

Considering the switch 52 further, the same effectively is an optically coupled SCR and can be connected directly to the line since there is no switching at ground level. Inasmuch as through the use of the anode-gate of the switch 84 the characteristics of a transistor are achieved, the characteristic curves therefor are symmetrical in both quadrants and, therefore, the switch acts both as a PNP and an NPN transistor, depending upon which polarity of the line exists at a particular time. The breakdown voltages (e.g., 400 volts) of the switch 84 are the same as a SCR and essentially equal in both directions. This switching arrangement can be used with 120 volts ac or 240 volts ac lines, and with the lines connected directly to the anodes of the switches 84 of the switches 52 through 55.

Each of the switches 52 through 55 is used as a switch, i.e., off or saturated. When current is driven into the LED 89, the switch 84 goes into saturation for either polarity of the line L1 and, thus, closes independently of this polarity. Inasmuch as the switch 52 is not a latching device, but is like a transistor, it operates smoothly through the zero point without any significant discontinuity and without any holding current being required. Thus there are no discontinuity effects like those of a conventional SCR, and the switch 84 acts like a saturated transistor and conducts if any voltage ac is applied of either polarity. The switch 84 also is a current limiting device. Thus, if two of the switches (52 and 54 or 53 and 55) overlap slightly in their switching functions, all that happens is that a small amount of current flows rather than directly connecting the two lines $L_1$ and $L_2$ together. Also, the operation of these switches 52 through 55 does not place any transients on the lines. The test impedance and bridge switch circuit 18, thus, is particularly useful in providing a relatively simple, efficient and accurate impedance sampling arrangement, and one which does not exhibit any problems from the standpoint of potentially shorting together the two lines L1 and L2 or applying switching transients thereto.

As has been noted earlier, the test impedance and bridge switch circuit 18 provides four-position sampling of the lines L1 and L2 by connecting the test impedance $Z_T$ to the lines in the configurations shown in FIGS. 3a through 3d. Depending upon the particular type of fault load $Z_L$, the output current in line 71 of the bridge will be of the nature of that shown in FIGS. 4a, 4b or 4c. This current is applied to the input of an amplifier 92 of the amplifier circuit 20 shown in FIG. 5b. An input diode circuit 93 is connected to the amplifier as a protective device, and the amplifier 92 has a feedback circuit connected therewith. The output of the amplifier 92 is applied to a full wave rectifier circuit 21 shown in FIG. 5b. Preferably, this is a high precision rectifier with no offsets. The rectifier circuit 21 includes as its principal components an amplifier 95, diodes 96 and 97 and an amplifier 98. Output line 99 provides a series of half sine wave pulses of varying heights to the RC network 22 which functions as a low-pass filter. This filter changes the pulsed half sine waves to a stepped waveform. The waveform from the RC network 22 is applied to the weighted average detector 23.

The weighted average detector 23 has an input terminal 101 which is connected through a resistor 102 to a lower input 103 of an amplifier 104. The terminal 101 also is connected through a potentiometer 105 and a resistor 106 to ground, the tap 107 of the potentiometer being connected to the upper input of the amplifier 104 and through a diode 108 to the output of this amplifier. A capacitor 109 is connected from the lower input 103 to ground. Line 110 provides the output of the weighted average detector 23, and this output is a dc voltage with a value proportional to the output signal of the bridge 18. The diode 108 functions as an on/off switch to change the gain of the amplifier 104. The amplifier output causes the diode to turn on when a large input signal occurs, thereby reducing the gain of the amplifier, when the input signal drops, the diode turns off. The potentiometer 105 enables adjustment of the weighting operation.

The detector 23 thus looks at groups of pulses and provides an average weighting thereof depending upon the amplitude of the pulses. In particular, when the output signals for the four sampling periods are all equal (like as shown in FIG. 4b), then the detector 23 performs a simple average thereon. Where the output signals for the four sampling periods vary as shown in FIGS. 4a and 4c, the detector 23 weights the average (by changing the gain of the amplifier 104 as noted above) such that the average of the output bridge waveform is equal to the average when the output of the bridge is like that shown in FIG. 4b. This is accomplished by weighting any portion of the waveform which is greater than the average at a percentage less than the weighting for a portion of the waveform which is below the average. That is, when a portion of the waveform is below the average, this portion is weighted at a standard level, and when above the average, it is weighted at a reduced value. Therefore, the result causes the average of waveforms like those shown in FIGS. 4a and 4c to be the same as the average of the waveform as shown in FIG. 4b and, thus, an equal response is obtained for a balanced or an unbalanced load on the power lines.

The output of the weighted average detector 23 in FIG. 5b is applied by the line 110 through a resistor 25 to a summing junction 120 shown to the left in FIG. 5c. Inasmuch as this signal is a dc voltage proportional to the output signal of the bridge 18, and inasmuch as there normally are line voltage variations, it is desirable that the output of the detector 23 be compared with a signal proportional to line voltage. Thus, the system of FIGS. 5a through 5c includes circuitry for developing a signal proportional to line voltage so as to eliminate effects of line voltage variation. For example, if the line voltage increases ten percent, so does the weighted average signal and, thus, it is desirable to ignore such variations. The manner in which this proportional line voltage signal is derived and applied through resistor 24 to the summing junction 120 so that this voltage and the weighted average may be subtracted from one another is described below.

In order to derive the proportional line voltage signal, a rectifier and filter 29 is connected across lines $L_1$ and $L_2$ by respective wires 130 and 131. This circuit 29 includes a rectifier 132, and a filter circuit comprising series resistors 133 and 134 and a shunt capacitor 135. The output of the rectifier and filter 29 is a dc voltage proportional to the average of the line voltage and is applied by lines 136 and 137 to a light emitting diode (LED) 138 of an optically coupled unit 139 employed in the isolated line voltage reference circuit 27. The unit 139 includes a light responsive transistor 140, and the output of the transistor 140 is proportional to the magnitude of the light from the LED 138. The emitter of the transistor 140 is connected as the upper input of a differential amplifier 141. Output line 142 of the amplifier 141 is connected to an LED 143 of a unit 144 similar to the unit 139. The units 139 and 144 each may be an H11–A2 sold by General Electric. The unit 144 also includes a light responsive transistor 145, the emitter of which is connected to the lower input of the differential amplifier 141. Line 146, connected to the upper end of the LED 143, provides the output of the isolated line voltage reference 27, and is connected through the resistor 24 (FIG. 5c) to the summing junction 120. A potentiometer and resistive network 147 is connected with the inputs of the differential amplifier 141 to allow balancing adjustment thereof.

The isolated line voltage reference 27, thus, is essentially a feedback servo. The upper LED 138 is driven through the series resistor 134 by a dc voltage proportional to line voltage, and the transistor 140 is controlled in response thereto. The current in the lower LED 143 is adjusted to be equal to the current in the upper LED 138 by the servo action of the circuit including the differential amplifier 141. The optical isolation provided by the units 139 and 145 also provides isolation from the power lines $L_1$ and $L_2$.

Considering further the signal proportional to line voltage applied through line 146 and the resistor 24 to the summing junction 120, as noted earlier this signal is mathematically summed with the weighted average signal applied through the resistor 25 to the summing junction 120. The latter signal is a dc voltage with a value proportional to the output signal of the bridge 18 (FIG. 5b). One of these two signals is negative with respect to the other and, thus, the signal proportional to line voltage effectively is subtracted from the weighted average signal. The resulting signal, which is not affected by line voltage variations and which is zero when there is no leakage impedance on either or both of the lines $L_1$ and $L_2$ to ground, is applied through a line 150 to the upper input of a meter amplifier 151. The output of the meter amplifier 151 is connected through a diode 152 to the meter 35. A variable resistor 153 allows adjustment of the meter amplifier circuit 33, and the physical scale of the meter 35 is calibrated appropriately to indicate the magnitude of the leakage current. In addition to the visual output provided by the meter 35, the system shown in FIGS. 5a–5c also provides other visual and audible alarm signals. These are provided by indicator lights and an audio alert (such as a sound device sold under the name Sonalert), shown in the lower left-hand corner of FIG. 5a. A typical alarm trigger point is 2 milliamperes RMS, total hazard current on the line. About 0.3 ma results from the test impedance $Z_T$ and, thus, about 1.7 ma is the minimum external leakage current that is detected in this case. Before proceeding to a discussion of these signal devices, the drive circuits therefor which are shown in FIG. 5c above the meter amplifier 33 will be described.

The signal on the line 150 applied to the meter amplifier circuit 33 also is applied by a line 156 to the lower input of a threshold detector 157 of alarm circuit 36. This threshold detector may be adjusted by means of a potentiometer 158 to set the desired alarm level. The output of the detector 157 is connected to the lower input of a nor gate 160. An output signal from the counter 48 is applied through a line 161 and a series connected resistor and capacitor to a rectifier circuit 162, the output of which is connected to the upper input of the gate 160. The signal on the line 161 also is applied to the upper input of a nor gate 164, the lower input thereto being applied from the output of the gate 160. The counter input to the alarm circuit causes a pulsating alarm tone to occur. Output line 165 from the nor gate 160 provides a signal to indicate that the leakage current is below the threshold, and functions to turn on a transistor switch 166 which, in turn, turns on a "safe" output Triac switch 167. Output line 168 of the gate 164 provides a signal to indicate that the leakage current is above the threshold and, thus, an alarm condition exists. This signal functions to turn on transistor switch 169 which, in turn, turns on "alarm" output Triac switch 170. In this manner, the alarm circuit 36 provides either a "safe" electrical output or an "alarm" electrical output.

The 37 safe" electrical output from the alarm circuit 36 is applied by a line 174 to a "safe" indicator light 175 (lower left-hand corner of FIG. 5a). In a similar manner, the "alarm" electrical signal is applied by a line 177 to a "hazard" indicator light 178 (FIG. 5a). These lights are illuminated by these respective electrical signals. The "alarm" signal on the line 177 also is applied to an audio alert device 179, the loudness of which can be adjusted by an adjustable resistor 180. A selector switch 182 is provided in the indicator circuitry shown in FIG. 5a, and when switched to its right position allows the audio alert 179 to operate under an alarm condition, but silences this alert unit when in its left position. An indicator 183 visually indicates the position of the switch 182. A test switch 185 is provided to allow the system to be tested by applying a pair of resistors 186–187 across the power lines $L_1$ and $L_2$. When the test switch 185 is depressed, a relay 189 moves its switch 190 to its upper position thereby connecting the center tap between the resistors 186 and 187 to ground and placing a fault impedance across the lines $L_1$ and $L_2$. This fault impedance is selected to cause a leakage current of approximately two milliamps.

Turning now to the counter 48 shown in FIG. 5c, the same provides output signals for driving the switches 52 through 55 of the bridge switch 18 to provide the four-position sampling described earlier. The counter 48 includes an input line 196 connected to the upper end of the secondary winding 42 of the power supply transformer 40 (FIG. 5a). This line 196 (FIG. 5c) is connected to the input of a pair of series connected nor gates 197–198 which function to standardize the 60 hertz line signal to suitable digital pulses. The output clock signal from the gate 198 is applied by a line 199 to the input of a first stage 200 of the counter 48. The counter 48 includes four stages, 200 through 203, connected as shown in FIG. 5c. The first stage 200 divides the 60 hertz clock signal down to 30 hertz, and this signal is applied as an input to the second stage 201. The second stage divides this input down to a 15 hertz signal which is applied as an input to both the third and fourth stages 202 and 203. These latter two stages 202 and 203 are connected as a Gray code counter which divides the 15 hertz signal by two down to 7.5 hertz, but the outputs of these last two stages are 90° out of phase with each other. The outputs of stages 202–203 provide the pulse waveforms (plus the inverse of these pulse waveforms, not shown) shown in FIG. 4d. These pulse outputs are applied to nor gates 206 through 209. More particularly, the upper output of the last stage 203 is connected to the nor gate 206, the lower output of the last stage 203 is connected to the nor gate 207, the lower output of the stage 202 is connected to the gate 208, and the upper output of the stage 202 is connected to the gate 209. Driver transistors 210 through 213 are respectively connected to the outputs of the gates 206 through 209. The emitters of these transistors 210 through 213 are connected through respective resistors 214 through 217 to output lines 76, 74, 77 and 75, respectively. These output lines 74–76 are connected to the test impedance and bridge switch 18 as noted earlier. The line 76 is connected to the LED of bridge switch 54, the line 74 is connected to the LED 89 of the bridge switch 52, the line 77 is connected to the LED of the bridge switch 55, and the line 75 is connected to the LED of the bridge switch 53. The signals on these lines supply current for turning on the respective LED's which, in turn, cause the respective associated switches to turn on and connect the test impedance $Z_T$ to one or both of the lines $L_1$ and $L_2$ as explained previously.

Finally, the system shown in FIGS. 5a through 5c includes a power supply 43 (FIG. 5a) including a bridge rectifier 230, a voltage regulator 231 and a voltage regulator 232. The power supply 43 provides a plus 12 volt output on output line 233, and a minus 12 volt output on an output line 234 for powering the various circuit and logic components of the system shown in FIGS. 5a through 5c.

The present embodiments of this invention are to be considered in all respects as illustrative and not restrictive, the scope of the invention being indicated by the appended claims rather than by the foregoing description or abstract of the disclosure, and all changes which come within the meaning and range of equivalency of the claims therefore are intended to be embraced therein.

What is claimed is:

1. A system for monitoring leakage current to ground in a power system having a pair of power lines, comprising impedance means for connection to said power lines, said impedance means having first and second terminals and a third intermediate terminal, switching means coupled to said power lines and to the first and second terminals of said impedance means for connecting said impedance means in predetermined configurations to one or both of said power lines, control means coupled to said switching means for providing four sampling periods and for causing said switching means to each assume a given state in sequence for, in turn, causing said impedance means to be connected in four different configurations to said power lines wherein (a) the first and second terminals are connected to the first of said power lines, (b) the first and second terminals are connected in one orientation across said power lines, (c) the first and second terminals are connected to the second of said power lines, and (d) the first and second terminals are connected in another orientation across said power lines, and said control means causing said sequence to occur repetitively, and measuring circuit means connected to said third terminal of said impedance means for measuring leakage current therethrough to ground and for providing an indication of leakage current.

2. A system as in claim 1 wherein
said impedance means comprises a single circuit having resistive and capacitive reactance components.

3. A system as in claim 2 wherein
said impedance means comprises a capacitor connected in series with a resistive component, and said first and second terminals are outer terminals connected to said switching means and said third terminal is an output terminal intermediate said capacitor and resistive component connected to said measuring circuit means.

4. A system as in claim 3 wherein
said resistive component comprises a fixed resistor and a variable resistor, said variable resistor enabling the resistive and capacitive reactance components of the impedance means to be adjusted to be equal and enable the impedance means to have a 45° phase angle.

5. A system as in claim 1 wherein
said switching means comprises four optically isolated switches each having an input and an output optically isolated from the other, the inputs of said switches being connected to said control means, and the outputs of said switches being connected to said power lines and to said first and second terminals of said impedance means.

6. A system as in claim 1 wherein
said switching means comprises a bridge including four switches, a first pair of said switches being connected across said power lines and the intermediate terminal between said first pair of switches being connected to said first terminal of said impedance means, and a second pair of said switches being connected across said power lines and having an intermediate terminal connected to said second terminal of said impedance means.

7. A system as in claim 6 wherein
said impedance means comprises resistive and capacitive reactance components connected in series.

8. A system as in claim 1 wherein said measuring means comprises
amplifier means connected to said third terminal of said impedance means for amplifying leakage current through said impedance means,
full-wave rectifier means connected to the output of said amplifier means,
filter means connected to the output of said rectifier means, and
weighted average detector means coupled to said filter means and having variable gain for weighting in different predetermined manners leakage current from said impedance means.

9. A system as in claim 8 wherein
said measuring means further includes means for providing a power line voltage reference, and summing means connected thereto and to said detector means for providing a mathematical summation of a line voltage reference and the output of said detector means.

10. A system as in claim 9 wherein
said measuring means includes alarm and indicating means connected with said summing means for providing respectively an alarm when a predetermined magnitude of leakage current exists and an indication of the magnitude of leakage current.

11. A system as in claim 9 wherein
said means for providing a power line voltage reference comprises a rectifier and filter circuit coupled with a line voltage reference circuit, said line voltage reference circuit including means for optically isolating the same from said rectifier and filter circuit.

12. A system for monitoring leakage current to ground in a power system having a pair of power lines, comprising
a single impedance means comprising resistive and capacitive reactance components with which said power lines can be loaded for enabling sampling of leakage current to ground, said impedance means having first, second and third terminals, switching means coupled to said power lines and to the first and second terminals of said impedance means for connecting said impedance means in predetermined different configurations to one or both of said power lines, control means coupled to said switching means for providing sampling periods and for causing each of said switching means to assume a given state in sequence for, in turn, causing said impedance means to be connected in plural different configurations to said power lines wherein (a) the first and second terminals are connected to the first of said power lines, (b) the first and second terminals are connected across said power lines, and (c) the first and second terminals are connected to the second of said power lines, and said control means causing said sequence to occur repetitively, and measuring circuit means connected to said third terminal of said impedance means for measuring leakage current therethrough to ground.

13. A system as in claim 12 wherein said switching means includes four switches caused to assume said given states in sequence by said control means for causing said impedance means to be connected in said different configurations to one or both of said power lines.

14. A system as in claim 13 wherein
said impedance means comprises a capacitor connected in series with a resistive component, and said first and second terminals are outer terminals connected to said switching means and said third terminal is an output terminal intermediate said capacitor and resistive component connected to said measuring circuit means.

15. A system for monitoring leakage current to ground in a power system having a pair of power lines, comprising
impedance means comprising a single circuit having resistive and capacitive reactance components and having first, second and third terminals,
switching means coupled to said power lines and to the first and second terminals of said impedance means for connecting said impedance means in four predetermined configurations to one or both of said power lines,
control means coupled to said switching means for providing plural sampling periods and for causing each said switching means to assume a given state in sequence for, in turn, causing said impedance means to be connected in said four different configurations to said power lines wherein (a) the first and second terminals are connected to the first of said power lines, (b) the first and second terminals are connected in one orientation across said power lines, (c) the first and second terminals are connected to the second of said power lines, and (d) the first and second terminals are connected in another orientation across said power lines, and said control means causing said sequence to occur repetitively, and measuring circuit means connected to said third terminal of said impedance means for measuring leakage current therethrough.

16. A test impedance and switching circuit for use in a system monitoring leakage current to ground in a power system having a pair of power lines, comprising
impedance means comprising a single circuit having resistive and capacitive reactance components and having first, second and third terminals, and
switching means for connection to said power lines connected to the first and second terminals of said impedance means for causing said impedance means to be connected in four predetermined configurations to said power lines wherein (a) the first and second terminals are connected to the first of said power lines, (b) the first and second terminals are connected in one orientation across said power lines, (c) the first and second terminals are connected to the second of said power lines, and (d) the first and second terminals are connected in another orientation across said power lines, said switching means comprising four switches each operable to a given state in sequence for causing said impedance means to be connected in said four different configurations to said power lines.

17. A circuit as in claim 16 wherein
said impedance means comprises a capacitor connected in series with a resistive component, and said first and second terminals are outer terminals connected to said switching means, said resistive component comprising a fixed resistor and a variable resistor for enabling the resistive and reactive components of said impedance means to be adjusted to be equal and enable the impedance means to have a 45° phase angle.

18. A method of monitoring leakage current to ground in a power system having a pair of power lines, comprising the steps of
connecting an impedance means comprising a single circuit having resistive and capacitive reactance components and having first, second and third terminals in an ordered sequence of configurations to said power lines in four sampling periods, said impedance configurations for said sampling periods including said first and second terminals of said impedance means being (a) connected to one of said power lines, (b) connected across said power lines in a first orientation, (c) connected to the other of said power lines, and (d) connected across said power lines in another orientation,
repeating said four period sampling of said power lines, and
measuring the leakage current from said third terminal of said impedance means to ground.

* * * * *